(12) United States Patent
Yaegashi et al.

(10) Patent No.: US 7,645,674 B2
(45) Date of Patent: Jan. 12, 2010

(54) SEMICONDUCTOR DEVICE HAVING AN OXIDE FILM FORMED ON A SEMICONDUCTOR SUBSTRATE SIDEWALL OF AN ELEMENT REGION AND ON A SIDEWALL OF A GATE ELECTRODE

(75) Inventors: Toshitake Yaegashi, Yokohama (JP); Junichi Shiozawa, Yokkaichi (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 164 days.

(21) Appl. No.: 11/835,353

(22) Filed: Aug. 7, 2007

(65) Prior Publication Data

US 2007/0281428 A1   Dec. 6, 2007

Related U.S. Application Data

(62) Division of application No. 11/109,763, filed on Apr. 20, 2005, now Pat. No. 7,315,073.

(30) Foreign Application Priority Data

Jan. 17, 2005   (JP)   ............................. 2005-009252

(51) Int. Cl.
   *H01L 21/336*   (2006.01)
(52) U.S. Cl. ................... 438/290; 438/221; 257/510; 257/390; 257/E21.409; 257/E21.691; 257/E27.081
(58) Field of Classification Search ................. 438/290, 438/221; 257/510, 390, E21.409, E21.691, 257/E27.081, E29.255
See application file for complete search history.

(56) References Cited

U.S. PATENT DOCUMENTS

| 6,406,976 B1 * | 6/2002 | Singh et al. ................. 438/423 |
| 6,580,117 B2 * | 6/2003 | Shimizu ..................... 257/315 |
| 6,613,647 B2 | 9/2003 | Kim |
| 2004/0104421 A1 | 6/2004 | Ozawa et al. |

FOREIGN PATENT DOCUMENTS

| JP | 2002-141409 | 5/2002 |
| JP | 2002-252291 | 9/2002 |
| JP | 2004-510330 | 4/2004 |
| JP | 2004-186185 | 7/2004 |
| JP | 2006-121023 | 5/2006 |

* cited by examiner

*Primary Examiner*—Thomas L Dickey
*Assistant Examiner*—Fazli Erdem
(74) *Attorney, Agent, or Firm*—Oblon, Spivak, McClelland, Maier & Neustadt, L.L.P.

(57) ABSTRACT

A first isolation is formed on a semiconductor substrate, and a first element region is isolated via the first isolation. A first gate insulating film is formed on the first element region, and a first gate electrode is formed on the first gate insulating film. A second isolation is formed on the semiconductor substrate, and a second element region is isolated via the second isolation. A second gate insulating film is formed on the second element region, and a second gate electrode is formed on the second gate insulating film. A first oxide film is formed between the first isolation and the first element region. A second oxide film is formed between the second isolation and the second element region. The first isolation has a width narrower than the second isolation, and the first oxide film has a thickness thinner than the second oxide film.

5 Claims, 11 Drawing Sheets

SEMICONDUCTOR DEVICE HAVING AN OXIDE FILM FORMED ON A SEMICONDUCTOR SUBSTRATE SIDEWALL OF AN ELEMENT REGION AND ON A SIDEWALL OF A GATE ELECTRODE

CROSS-REFERENCE TO RELATED APPLICATIONS

This application is a Divisional of U.S. application Ser. No. 11/109,763, now allowed, which is based upon and claims the benefit of priority from prior Japanese Patent Application No. 2005-009252, filed Jan. 17, 2005, the entire contents of both of which are incorporated herein by reference.

BACKGROUND OF THE INVENTION

1. Field of the Invention

The present invention relates to a semiconductor device having an oxide film formed on a semiconductor substrate sidewall of an element region and on a sidewall of a gate electrode.

2. Description of the Related Art

Several elements (transistors) forming a semiconductor device are mutually isolated via an isolation region formed on a semiconductor substrate. These elements each have different characteristics required in accordance with their functions. Moreover, the dimension of element region and isolation region is different in accordance with the characteristics.

For example, a non-volatile semiconductor memory having a two-layer gate electrode comprising a floating gate electrode and a control gate electrode is given as one example. In order to obtain a mass storage capacity, a memory cell requires to micro-fabricate the foregoing element region and isolation region as much as possible. On the other hand, in a peripheral transistor forming a peripheral circuit for driving the memory cell, the allowable dimension of the element region and isolation region is determined in accordance with required electric characteristics. For example, a high-voltage driving transistor is formed of an element region larger than the memory cell and an isolation region to prevent a leak current.

The following technique is employed to form the preceding memory cell and peripheral circuit. According to the technique, an isolation trench is formed, and thereafter, a semiconductor substrate sidewall functioning as an element region is oxidized. Etching damages caused in a semiconductor substrate are repaired when the isolation trench is formed, thereby preventing a junction leak current of impurities formed on the element region. The technique will be described below with reference to the drawings giving a NAND non-volatile memory device as one example.

FIG. 1A is a cross-sectional view showing a memory cell in the channel width direction. FIG. 1B is a cross-sectional view showing a peripheral transistor in the channel width direction.

The NAND non-volatile memory device is formed according to the following manufacturing method. Impurity ions are implanted into a silicon substrate 101 to form well of memory cell, channel region 102a, well of peripheral transistor and channel region 102b, and thereafter, a gate insulating film 103 is formed. Then, a floating gate electrode of the memory cell and a first gate electrode layer consisting of polysilicon are formed on the gate insulating film 103. In this case, the first gate layer functions as a gate electrode of peripheral and select transistors. Thereafter, a mask material (not shown) used for forming an isolation region is formed on the gate insulating film 103. A resist film protecting the element region is patterned using a lithography process, and the foregoing mask material, first gate electrode layer, gate insulating film 103 and silicon substrate 101 are successively etched. Trenches, that is, an isolation region 107a of the memory cell and an isolation region 107b of the peripheral transistor are formed to isolate (partition) the element region 106a thereof and the element region 106b thereof from each other.

The surface of the silicon substrate is oxidized using thermal oxidization to form silicon oxide films 108a and 108b. In this case, the silicon oxide film 108a is formed on the trench surface of isolation regions 107a of the memory cell. The silicon oxide film 108b is formed on the trench surface of isolation regions 107b of the peripheral transistor. The thermal oxidization is carried out, and thereby, a sidewall of a gate electrode 104a of the memory cell is formed with a silicon oxide film 109a. Simultaneously, a sidewall of a gate electrode 104b of the peripheral transistor is formed with a silicon oxide film 109b.

Thereafter, the trench functioning as the isolation region is formed with an isolation insulating film 110, and planarized using CMP to remove the mask material. The height of the isolation insulating film 110 of the memory cell is reduced using etching as the need arises to form an inter-gate insulating film 111.

A part of the inter-gate insulating film 111 is removed in the peripheral transistor and the select transistor. Thereafter, a control gate electrode 112a of the memory cell, that is, second gate electrode layer is formed. In this case, the second gate electrode layer comprises a stacked film of polysilicon and silicide. In the peripheral transistor and the select transistor, the foregoing first and second gate electrode layers are electrically connected. Then, the gate electrode is patterned using lithography technique, and second gate electrode, inter-gate insulating film and first second gate electrode are successively etched to form a gate electrode.

Thereafter, an interlayer insulating film 114 is formed, and then, source/drain diffusion layer, contact electrode 115 and interconnect 116 are formed using a generally known process. In the manner as described, memory cell and peripheral transistor are formed as shown in FIG. 1A and FIG. 1B.

Silicon oxide films 108a and 108b formed on each sidewall of element regions 106a and 106b are formed having a thickness of 4 nm using dry oxidization at temperature of 1035° C. FIG. 2A and FIG. 2B are each enlarged views showing element regions, gate insulating film and gate electrode in the foregoing formation.

The silicon oxide film 108b formed on the sidewall of the element region 106b has a thickness T'sb required for preventing a junction leak current of the peripheral transistor. Even if excessive oxidization is given to the memory cell, the silicon oxide film 108a formed on the sidewall of the element region 106a of the memory cell has the same thickness T'sa as T'sb. For this reason, if the scale-down of the memory cell advances, the width of the element region 106a becomes narrow more than the necessity in the memory cell. As a result, there is a problem that device characteristic is worsened.

Moreover, in oxidization of the sidewall of the element region, the sidewall of the first gate electrode layer is also oxidized. The first gate electrode is formed of polysilicon; for this reason, it is oxidized faster than the silicon substrate formed of single crystal silicon. As a result, the width of a channel region controlled by the gate electrode becomes smaller than that of the element region. The oxidized amount of the sidewall of the first gate electrode layer, that is, thickness T'ga and T'gb in the memory cell and the peripheral transistor are the same. Since the peripheral transistor has a large-width element region 106b, the sidewall of the first gate electrode layer has almost no influence by oxidization. However, the memory cell has a small-width element region 106a. For this reason, the sidewall of the first gate electrode layer is oxidized, and thereby, the width of an effective channel region is reduced. As a result, there is a problem that device characteristic is worsened.

In oxidization of each sidewall of the silicon substrate and the gate electrode using thermal oxidization, the oxidization rate of the polysilicon gate electrode is faster than that of the silicon substrate formed of single crystal silicon. For this reason, the gate electrode is oxidized more than the silicon substrate. As a result, the end of the gate electrode 104a of the memory cell is positioned inside from that of the element region 106a formed on the silicon substrate by L'a. Likewise, the end of the gate electrode 104b of the peripheral transistor is positioned inside from that of the element region 106b formed on the silicon substrate by L'b. In this case, the foregoing distances L'a and L'b have the same value.

In oxidization of the sidewall of the element region, an oxidizing agent diffuses in the gate insulating film. For this reason, oxidization is given to the gate insulating film from the lateral direction; as a result, a wedge-shaped oxide film is formed. The wedge-shaped oxide film is formed in the same manner in the memory cell and the peripheral transistor. More specifically, a horizontal distance B'sa of the formed wedge-shaped oxide film from the end of the element region 106a of the memory cell is given. A horizontal distance B'sb of the formed wedge-shaped oxide film from the end of the element region 106b of the peripheral transistor is given. In this case, the horizontal distance B'sa is the same as the horizontal distance B'sb. Likewise, a horizontal distance B'ga of the formed wedge-shaped oxide film from the end of the gate electrode 104a of the memory cell is given. A horizontal distance B'gb of the formed wedge-shaped oxide film from the end of the gate electrode 104b of the peripheral transistor is given. In this case, the horizontal distance B'ga is the same as the horizontal distance B'gb.

Moreover, an angle θ'sa of the wedge-shaped oxide film formed at the end of the element region 106a of the memory cell is given. An angle θ'sb of the wedge-shaped oxide film formed at the end of the element region 106b of the peripheral transistor is given. In this case, the angle θ'sa is the same as the angle θ'sb. Likewise, an angle θ'ga of the wedge-shaped oxide film formed at the end of the gate electrode 104a of the memory cell is given. An angle θ'gb of the wedge-shaped oxide film formed at the end of the gate electrode 104b of the peripheral transistor. In this case, the angle θ'ga is the same as the angle θ'gb. The peripheral transistor does not so receive an influence by the wedge-shaped oxide film because it has a large-width element region. On the contrary, the memory cell has a small-width element region; for this reason, the wedge-shaped oxide film is formed, thereby increasing an effective thickness of the gate insulating film. As a result, there is a problem that device characteristic is worsened.

In order to solve the foregoing problem, the isolation regions of the memory cell and the peripheral transistor are formed separately from each other. By doing so, oxidization to the sidewall of the element region is carried out separately. However, in this case, the formation of the isolation region must be carried out two times, and this is a factor of causing the following problem. In other words, an area of the boundary for separately forming the memory cell and the peripheral transistor increases, and the number of manufacturing processes increase; as a result, the manufacture cast increases.

JPN. PAT. APPLN. KOKAI Publication No. 2004-186185 discloses the following proposal. According to the proposal, polysilicon layer and silicon substrate are etched to form an isolation trench. Thereafter, each exposed surface of the silicon substrate and the polysilicon layer is formed with a silicon oxide film having a thickness of 5 nm using thermal oxidization. However, the foregoing proposal can not solve the problem that the device characteristic of the memory cell is worsened.

BRIEF SUMMARY OF THE INVENTION

According to one aspect of the present invention, there is provided a semiconductor device comprising: a semiconductor substrate; a first isolation region formed on the semiconductor substrate; a first element region isolated via the first isolation region; a first gate insulating film formed on the first element region; a first gate electrode formed on the first gate insulating film; a second isolation region formed on the semiconductor substrate; a second element region isolated via the second isolation region; a second gate insulating film formed on the second element region; a second gate electrode formed on the second gate insulating film; a first oxide film formed between the first isolation region and the first element region; and a second oxide film formed between the second isolation region and the second element region.

The first isolation region has a width narrower than the second isolation region, and the first oxide film having a thickness thinner than the second oxide film.

According to another aspect of the present invention, there is provided a semiconductor device comprising: a semiconductor substrate; a first isolation region formed on the semiconductor substrate; a first element region isolated via the first isolation region; a first gate insulating film formed on the first element region; a first gate electrode formed on the first gate insulating film; a second isolation region formed on the semiconductor substrate; a second element region isolated via the second isolation region; a second gate insulating film formed on the second element region; and a second gate electrode formed on the second gate insulating film.

The first isolation region has a width narrower than the second isolation region. The first gate electrode contacting with the first gate insulating film has a width narrower than the first element region contacting with the first gate insulating film in a channel width direction of the first element region. The second gate electrode contacting with the second gate insulating film has a width narrower than the second element region contacting with the second gate insulating film in a channel width direction of the second element region. A horizontal distance from the end of the first element region to the end of the first gate electrode in the channel width direction of the first element region is smaller than a horizontal distance from the end of the second element region to the end of the second gate electrode in the channel width direction of the second element region.

According to one aspect of the present invention, there is provided a method of manufacturing a semiconductor device, comprising: forming a film functioning as a gate insulating film and a film functioning as a gate electrode on a semiconductor substrate; removing the film functioning as a gate electrode, the film functioning as a gate insulating film and the semiconductor substrate to form a first isolation trench, and forming a first element region, a first gate insulating film and a first gate electrode, which are isolated via the first isolation trench; removing the film functioning as a gate electrode, the film functioning as a gate insulating film and the semiconductor substrate to form a second isolation trench, and forming a second element region, a second gate insulating film and a second gate electrode, which are isolated via the second isolation trench; and forming a first oxide film on a sidewall of the first element region while forming a second oxide film on a sidewall of the second element region. The first isolation trench has a width narrower than the second isolation trench, and the first oxide film has a thickness thinner than the second oxide film.

DETAILED DESCRIPTION OF THE INVENTION

Figure 1A:
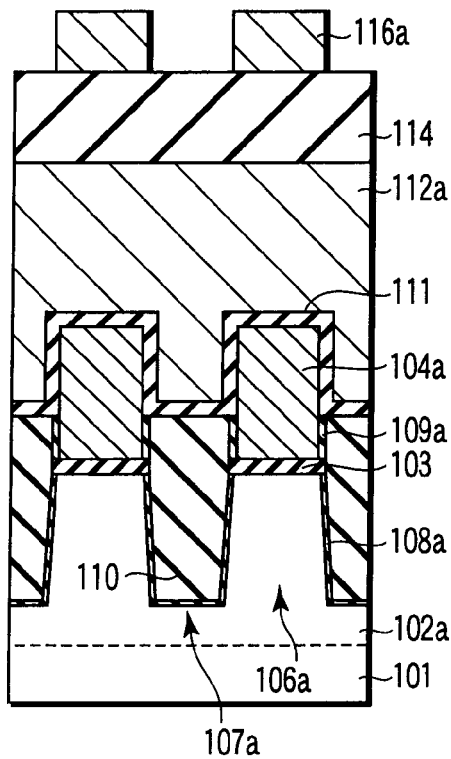
FIG. 1A and FIG. 1B are cross-sectional views showing a conventional semiconductor device.
Figure 1B:
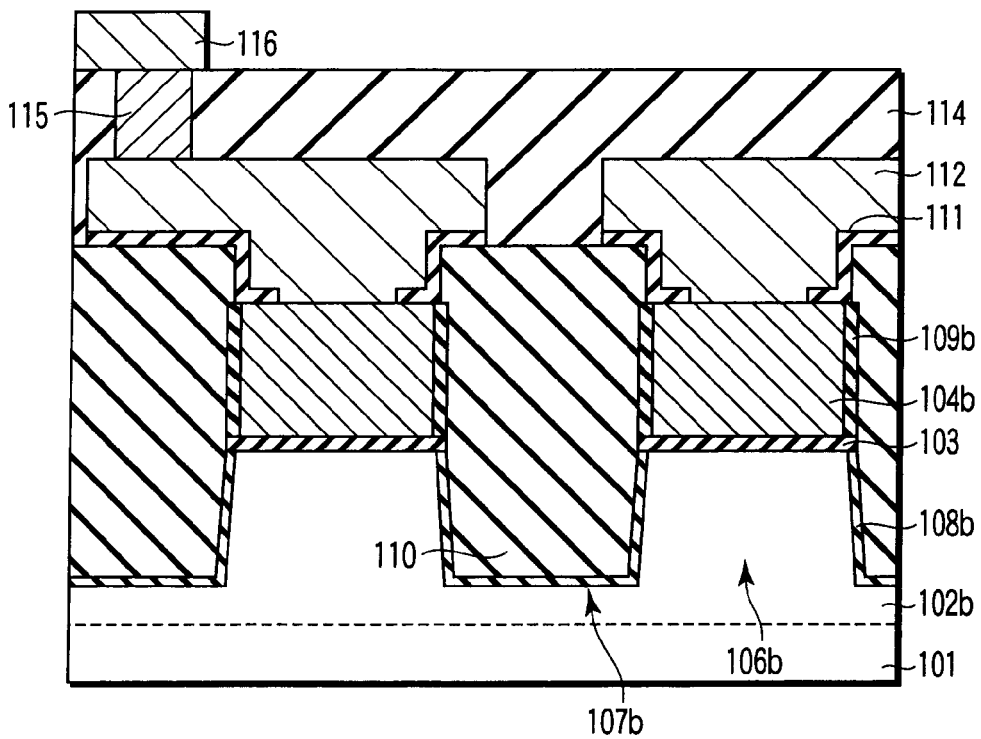
Figure 2A:
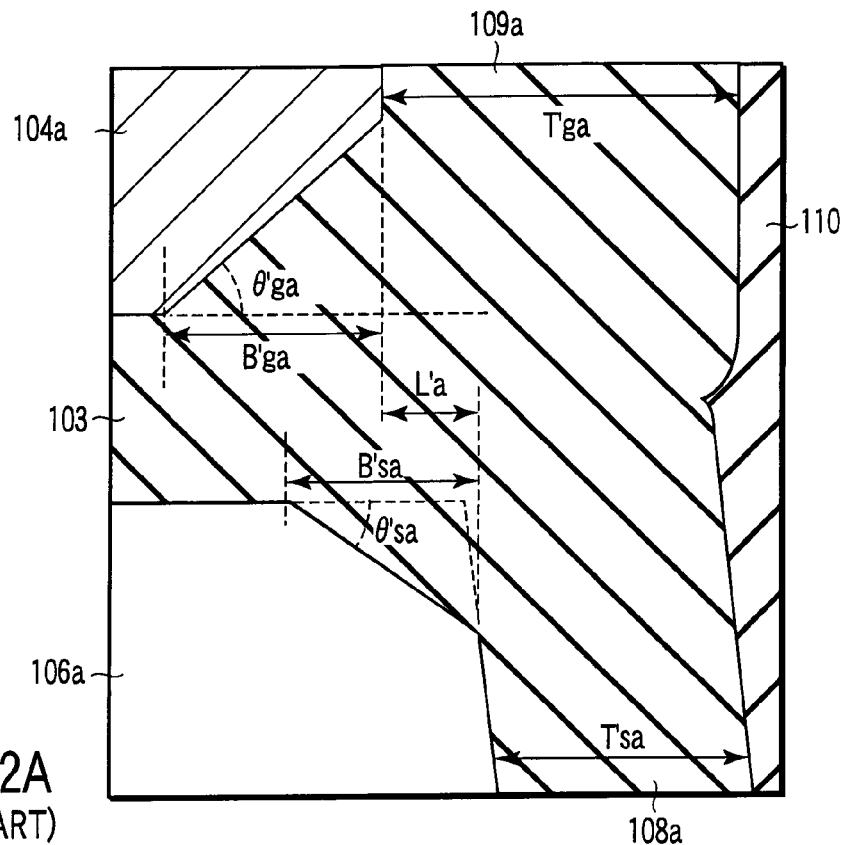
FIG. 2A and FIG. 2B are enlarged views showing a portion stacked with element region, gate insulating film and gate electrode in the semiconductor device shown in FIG. 1A and FIG. 1B.
Figure 2B:
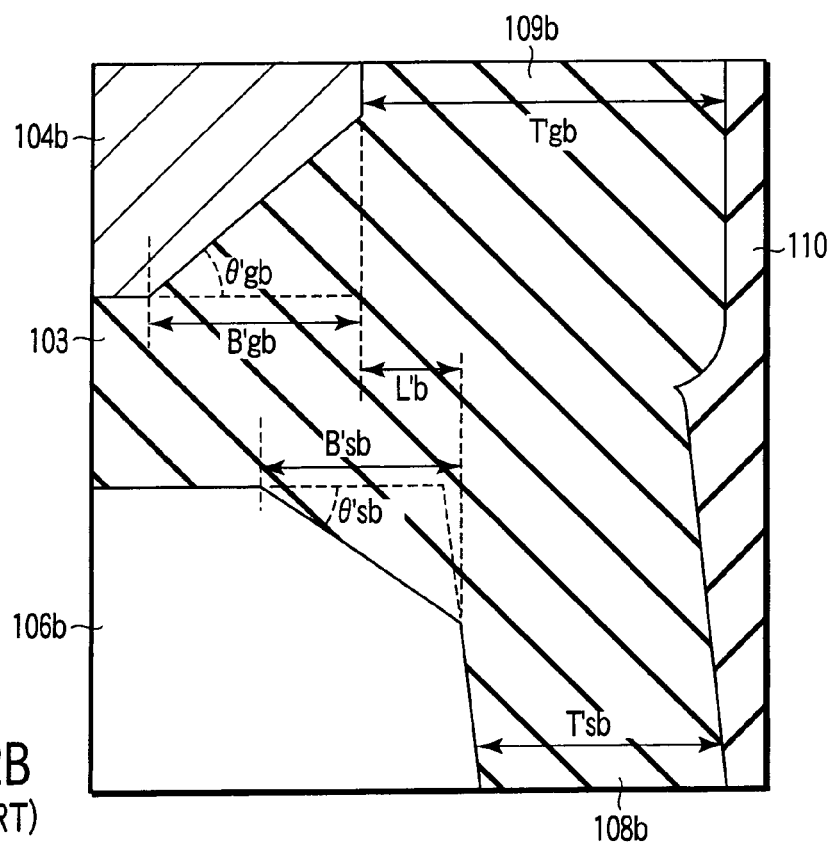

A semiconductor device according to an embodiment of the present invention and a method of manufacturing the same device will be described below with reference to the accompanying drawings. In the following description, the same reference numerals are used to designate portions common to all drawings.

According to the embodiment, a memory cell of a NAND non-volatile semiconductor memory is given as an example in which an isolation region width is narrow while a peripheral transistor thereof is given as an example in which it is wide. The foregoing memory cell and peripheral transistor will be explained with reference to FIG. 3A and FIG. 3B to FIG. 12A and FIG. 12B. The peripheral transistor forms a circuit required for data write and read to the memory cell, and is formed on the same semiconductor substrate as the memory cell.

Figure 3A:
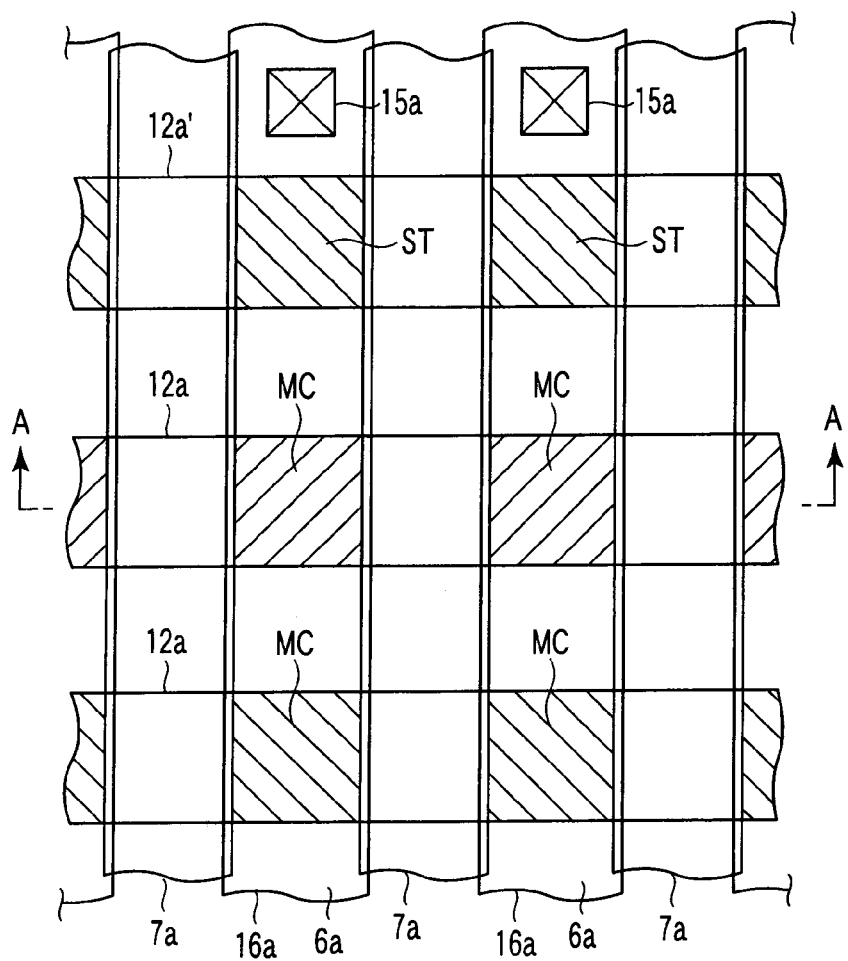
FIG. 3A and FIG. 3B are top plan views showing the configuration of a semiconductor device according to an embodiment of the present invention.
Figure 3B:
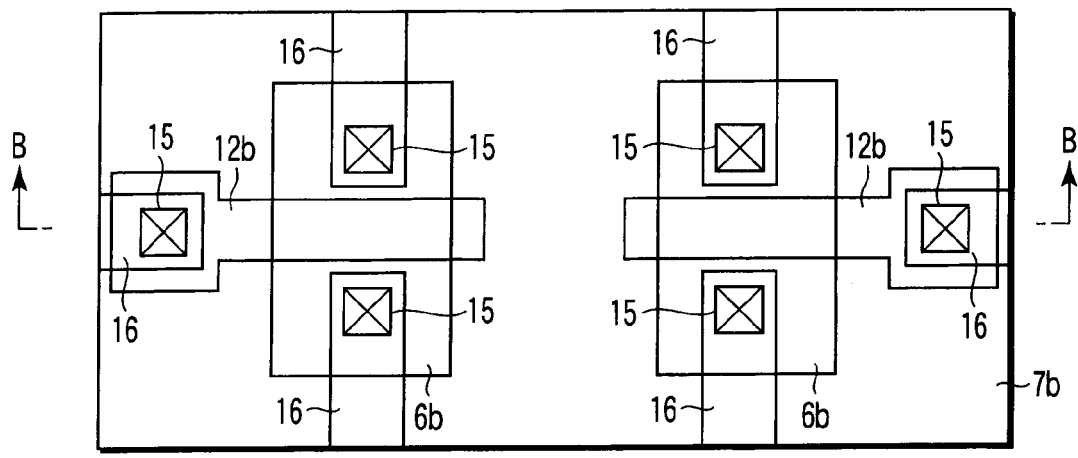

FIG. 3A is a top plan view showing a memory cell array of the NAND non-volatile semiconductor memory of the present invention. FIG. 3B is a top plan view showing a peripheral transistor of the NAND non-volatile semiconductor memory.

As shown in FIG. 3A, element regions 6a isolated via isolation regions 7a are formed on a silicon semiconductor substrate. Each NAND cell unit has the configuration that series-connected several memory cells MC and a select transistor ST are formed on the element region 6a. The select transistor ST is connected to one end of series-connected several memory cells MC. Memory cells MC arrayed in the direction of a word line 12a have their gates connected via a common word line (control gate electrode) 12a. Select transistors ST have their gates connected via a common select gate line 12a'. One end of a current path of each select transistor ST is connected with a bit line 16a via a bit line contact 15a.

As illustrated in FIG. 3B, the peripheral transistor is formed on an element region 6b above the same silicon semiconductor substrate formed with the memory cells. The peripheral transistor has gate electrode 12b, and source/drain region formed on the element region 6b. The gate electrode 12b is connected with interconnection 16 for making a connection between elements (peripheral transistors) via an electrically connected contact electrode 15. The element region 6b is isolated via an isolation region 7b.

Figure 4A:
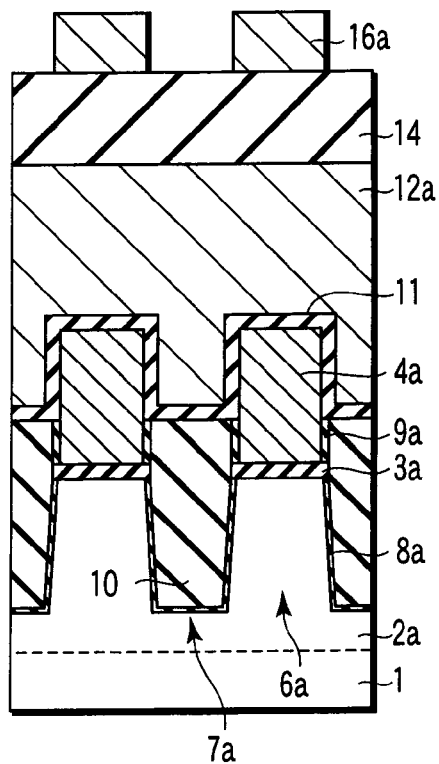
FIG. 4A and FIG. 4B are cross-sectional views taken along lines A-A and B-B respectively in the semiconductor device of the embodiment.
Figure 4B:
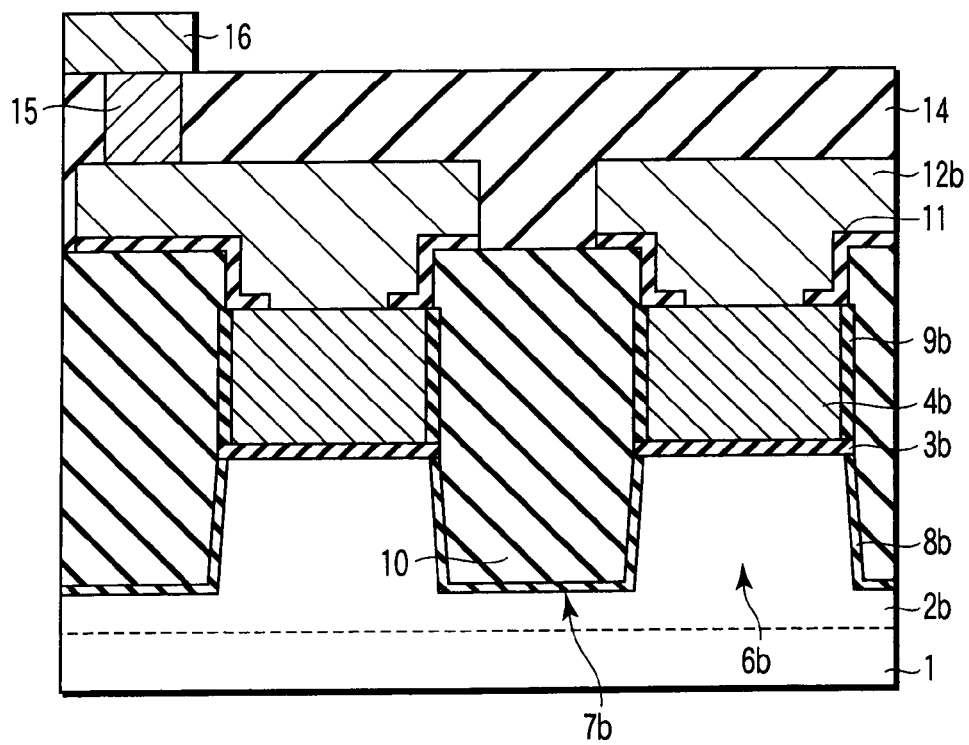

FIG. 4A is a cross-section view taken along a line A-A of the memory cell array shown in FIG. 3A. FIG. 4B is a cross-section view taken along a line B-B of the peripheral transistor shown in FIG. 3B.

The structure of the memory cell array shown in FIG. 4A will be described below.

A well/channel region 2a is formed above a silicon semiconductor substrate 1. The well/channel region 2a is formed with a projected element region 6a. Several element regions 6a are arrayed with a predetermined interval. An isolation region 7a is formed between the element regions 6a. The isolation region 7a is formed in a manner that an insulating film such as silicon oxide film and silicon nitride film is buried in an isolation trench formed between the element regions 6a. In this embodiment, a silicon oxide film is buried therein. Moreover, a silicon oxide film 8a is formed between the element region 6a and the isolation region 7a. In other words, the sidewall of the element region 6a is formed with the silicon oxide film 8a.

A gate insulating film 3a is formed on the element region 6a. A gate electrode 4a is formed on the gate insulating film 3a. The side of the gate electrode 4a is formed with a silicon oxide film 9a.

An inter-gate insulating film 11 is formed on the gate electrode 4a and the isolation region 7a. A control gate electrode 12a is formed on the inter-gate insulating film 11. Moreover, an interlayer insulating film 14 is formed on the control gate electrode 12a. A bit line 16a is formed on the interlayer insulating film 14.

The structure of the peripheral transistor shown in FIG. 4B will be described below.

A well/channel region 2b is formed above a silicon semiconductor substrate 1. The well/channel region 2b is formed with a projected element region 6b. Several element regions 6b are arrayed with a predetermined interval. An isolation region 7b is formed between the element regions 6b. The isolation region 7b is formed in a manner that an insulating film such as silicon oxide film and silicon nitride film is buried in an isolation trench formed between the element regions 6b. In this embodiment, a silicon oxide film is buried therein.

Moreover, a silicon oxide film 8b is formed between the element region 6b and the isolation region 7b. In other words, the sidewall of the element region 6b is formed with the silicon oxide film 8b.

In this case, the element region 6a of the memory cell has a width (channel-width direction length) smaller than the element region 6b of the peripheral transistor. The isolation region 7a of the memory cell has a width (channel-width direction length) smaller than the isolation region 7b of the peripheral transistor. For example, the width of the isolation region 7a of the memory cell is less than 0.1 µm while the width of the isolation region 7b of the peripheral transistor is more than 1 µm. The silicon oxide film 8a formed at the sidewall of the element region 6a of the memory cell is formed thinner than the silicon oxide film 8b formed at the sidewall of the element region 6b of the peripheral transistor.

A gate insulating film 3b is formed on the element region 6b. A gate electrode 4b is formed on the gate insulating film 3b. The side of the gate electrode 4b is formed with a silicon oxide film 9b. The silicon oxide film 9a formed at the sidewall of gate electrode 4a of the memory cell is formed thinner than the silicon oxide film 9b formed at the sidewall of the gate electrode 4b of the peripheral transistor.

An inter-gate insulating film 11 is formed on the gate electrode 4b and the isolation region 7b. In this case, a part of the inter-gate insulating film 11 formed on the gate electrode 4b and the isolation region 7b is removed. A gate electrode 12b formed of the same film as the control gate electrode 12a is formed on the inter-gate insulating film 11 and the gate electrode 4b having the partially removed inter-gate insulating film 11. Moreover, an interlayer insulating film 14 is formed on the control gate electrode 12a. An interconnect (wiring) 16 is formed on the interlayer insulating film 14. The interconnect 16 is electrically connected to the gate electrode 12b via a contact electrode 15 formed in the interlayer insulating film 14.

In the memory cell shown in FIG. 4A and the peripheral transistor shown in FIG. 4B, the silicon substrate 1 is etched to form the isolation trench in order to form isolation regions 7a and 7b. The isolation trench is formed using RIE (Reactive Ion Etching); for this reason, damage occurs in the silicon substrate 1. Thermal oxidization is carried out to recovery the damage occurring in the silicon substrate 1, and thereby, silicon oxide films 8a and 8b are formed. Therefore, an amount of oxidization increases resulting from thermal oxidization, and thereby, damage is sufficiently recovered while the silicon substrate 1 is further oxidized. As a result, the width of the element region is reduced.

The non-volatile semiconductor memory of this embodiment has the structure given below. That is, the silicon oxide film 8a formed at the sidewall of the element region 6a of the memory cell is formed thinner than the silicon oxide film 8b formed at the sidewall of the element region 6b of the peripheral transistor. By doing so, it is possible to increase an amount of oxidization for recovering the damage, and to make thin the silicon oxide film 8a even if the silicon oxide film 8b is formed thicker. In order to drive high voltage, the peripheral transistor has a need to make small a junction leak current between the source/drain diffusion region and the well/channel region on the silicon substrate 1. Therefore, the foregoing structure serves to sufficiently recover etching damage in the peripheral transistor. On the other hand, high voltage is not applied to the memory cell more than the peripheral transistor; thus, the damage may be recovered by the necessary minimum. In the memory cell, an operation is required in the micro-fabricated element region 6a. Thus, the amount of oxidization of the sidewall of the element region 6a is reduced, thereby preventing the width of the element region 6a from being narrowed. Therefore, high-performance device characteristic is obtained. On the other hand, the peripheral transistor has a sufficiently wide element region width capable of disregarding the amount of oxidization of the sidewall of the element region 6a. Thus, there is no problem even if the amount of oxidization of the sidewall of the element region 6a is increased more than the memory cell.

Figure 6A:
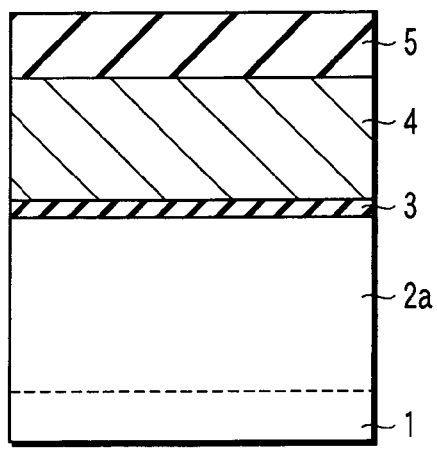
FIG. 6A and FIG. 6B are cross-sectional views to explain a first process of the method of manufacturing the semiconductor device of the embodiment.
Figure 6B:
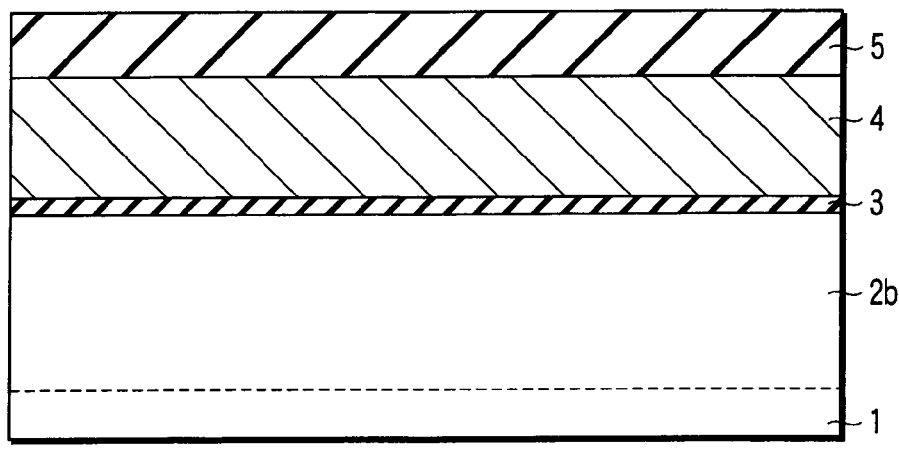

The non-volatile semiconductor memory of this embodiment is manufactured using the following method in order to prevent parasitic transistor (corner transistor) from being formed at the corner of the element region. As depicted in FIG. 6A and FIG. 6B, a first polysilicon gate electrode layer 4 is formed on the gate insulating film above the silicon substrate 1. The gate electrode layer 4 functions as a floating gate electrode of the memory cell and a gate electrode of the peripheral and select transistors. A mask material 5 used for etching the isolation trench is formed on the first gate electrode layer 4. A resist film for protecting the element region is patterned and formed on the mask material 5 using lithography process. Then, mask material 5, first gate electrode layer 4, gate insulating film 3 and silicon substrate 1 are successively etched to form the isolation trench for forming an isolation region in the silicon substrate 1. Thereafter, thermal oxidization is carried out so that the sidewall of the element region is formed with a silicon oxide film. When the silicon substrate 1 of the element region is oxidized, the side of the first gate electrode layer 4 is also oxidized. As described before, the foregoing mask material 5, first gate electrode layer 4, gate insulating film 3 and silicon substrate 1 are etched via one-time etching process. By doing so, it is possible to prevent misalignment between the element region 6a and the floating gate electrode 4a and misalignment between the element region 6b and the gate electrode 4b, as seen from FIG. 7a and FIG. 7B. This contributes to preventing the disadvantage described below. That is, misalignment occurs between the element region and the gate electrode; for this reason, the gate electrode gives an influence to the sidewall of the element region. As a result, a parasitic transistor is formed at the corner of the element region.

Moreover, the non-volatile semiconductor memory of this embodiment has the structure given below. That is, the silicon oxide film 9a formed at the sidewall of the gate electrode 4a of the memory cell is formed thinner than the silicon oxide film 9b formed at the sidewall of the gate electrode 4b of the peripheral transistor. By doing so, it is possible to recover etching damage required for making small a junction leak current of the peripheral transistor. Simultaneously, the silicon oxide film 9a formed at the sidewall of the gate electrode 4a of the memory cell is formed thinner. As a result, it is possible to prevent a reduction of effective channel width determined depending on the gate electrode width of micro-dimension memory cell, and to obtain high device characteristic. On the other hand, the peripheral transistor has a sufficiently wide element region width capable of disregarding the amount of oxidization of the sidewall of the gate electrode 4b. Thus, there is no problem even if the amount of oxidization of the sidewall of the gate electrode 4b is increased more than the memory cell.

Figure 5A:
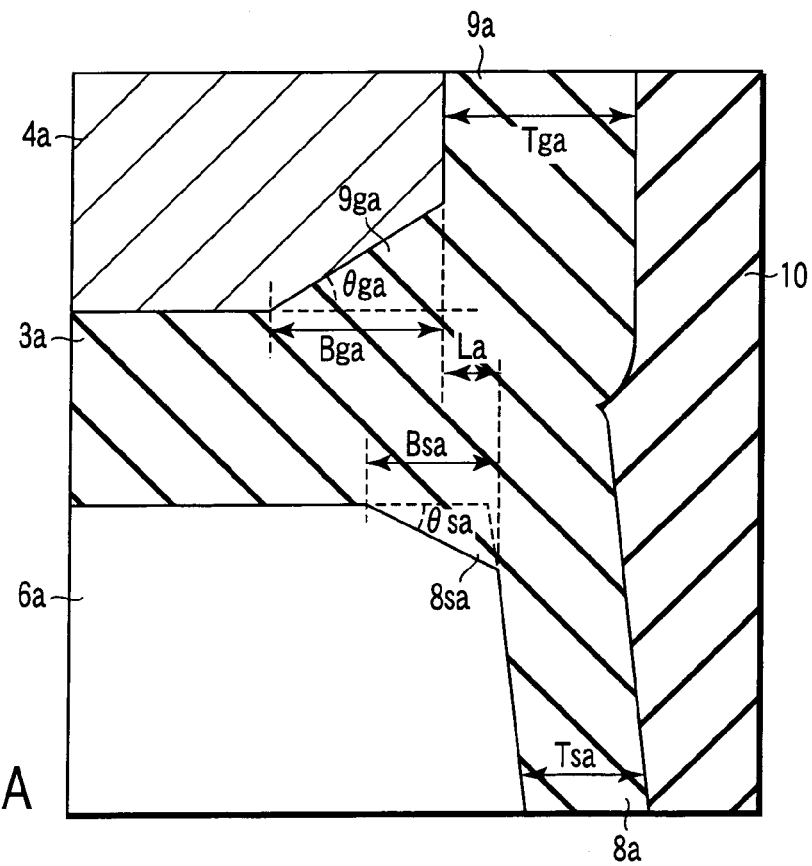
FIG. 5A and FIG. 5B are enlarged views showing a portion stacked with element region, gate insulating film and gate electrode in the semiconductor device shown in FIG. 4A and FIG. 4B.
Figure 5B:
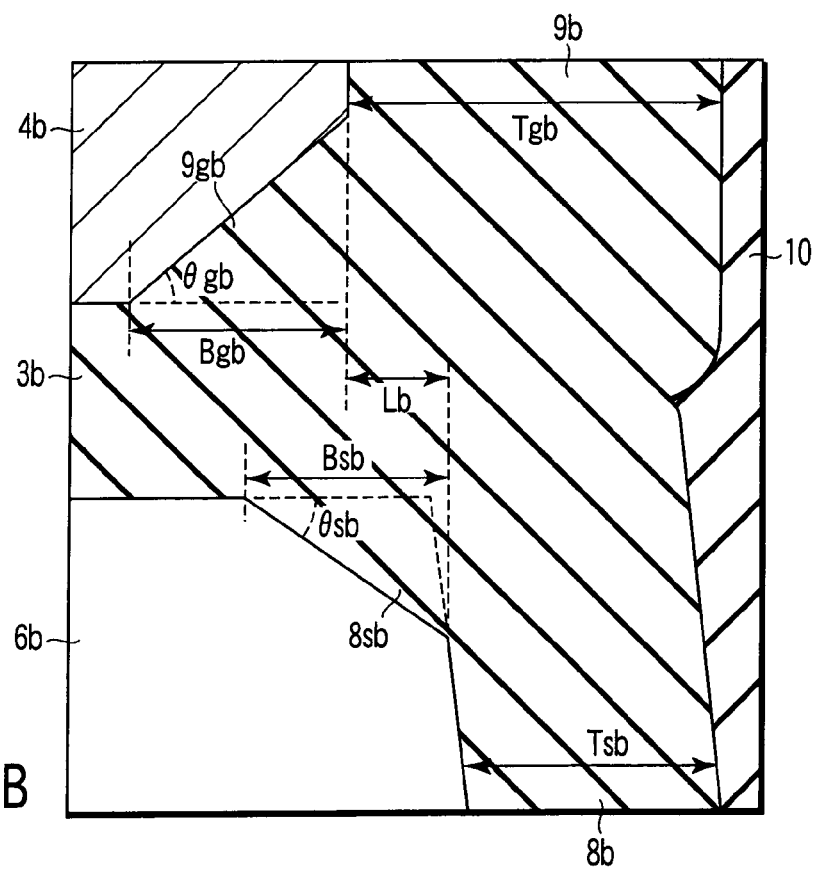

FIG. 5A is an enlarged view showing a portion stacked with element region 6a, gate insulating film 3a and gate electrode 4a in the memory cell shown in FIG. 4A. FIG. 5B is an enlarged view showing a portion stacked with element region 6b, gate insulating film 3b and gate electrode 4b in the peripheral transistor shown in FIG. 4B.

The silicon oxide film 8a formed at the sidewall of the element region 6a of the memory cell is formed thinner than the silicon oxide film 8b formed at the sidewall of the element region 6b of the peripheral transistor. In other words, the silicon oxide film 8a has a thickness Tsa thinner than a thickness Tsb of the silicon oxide film 8b. The silicon oxide film 9a formed at the sidewall of the gate electrode 4a of the memory cell is formed thinner than the silicon oxide film 9b formed at the sidewall of the gate electrode 4b of the peripheral transistor. In other words, the silicon oxide film 9a has a thickness Tga thinner than a thickness Tgb of the silicon oxide film 9b.

The sidewalls of the element region (silicon substrate) and the gate electrode are oxidized using thermal oxidization. In this case, the oxidization rate of the polysilicon gate electrode is faster than that of the element region formed of single crystal silicon. Therefore, the sidewall of the gate electrode is oxidized more than that of the element region. The end of the gate electrode 4a of the memory cell is positioned inside from the end of the element region 6a by a distance La. Likewise, the end of the gate electrode 4b of the peripheral transistor is positioned inside from the end of the element region 6b by a distance Lb.

A ratio of the oxidization rate of polysilicon to single crystal silicon does not depend on the width of the isolation region. However, the width of the isolation region is narrow; therefore, oxidization is restrained. As a result, the distance La has a value smaller than the distance Lb. The foregoing features is used, and thereby, the sidewalls of element regions 6a and 6b are respectively formed with silicon oxide films 8a and 8b so that a recess is formed in the isolation trench formed with the isolation region, as shown in FIG. 5A and FIG. 5B. Thereafter, the following structure is given, that is, the isolation trench is fully filled with the silicon oxide film 10. By doing so, the following prediction is given even if it is difficult to measure each thickness of silicon oxide films 8a and 8b formed at the sidewalls of the element regions. Namely, the silicon oxide film 8a of the memory cell has the thickness Tsa thinner than the thickness Tsb of the silicon oxide film 8a of the peripheral transistor.

In the non-volatile semiconductor memory of this embodiment, the end portion of the gate insulating film 3a of the memory cell is formed with wedge-shaped oxide films 8sa and 9ga as shown in FIG. 5A. On the other hand, the end portion of the gate insulating film 3b of the peripheral transistor is formed with wedge-shaped oxide films 8sb and 9gb as shown in FIG. 5B. In this case, the wedge-shaped oxide films 8Sa and 9ga are formed smaller than wedge-shaped oxide films 8Sb and 9gb. In other words, a horizontal distance Bsa of the formed wedge-shaped oxide film 8sa from the end of the element region 6a of the memory cell is given. A horizontal distance Bsb of the formed wedge-shaped oxide film 8sb from the end of the element region 6b of the peripheral transistor is given. In this case, the horizontal distance Bsa is smaller than the horizontal distance Bsb. Likewise, a horizontal distance Bga of the formed wedge-shaped oxide film 8sa from the end of the gate electrode 4a of the memory cell is given. A horizontal distance Bgb of the formed wedge-shaped oxide film 8sb from the end of the gate electrode 4b of the peripheral transistor is given. In this case, the horizontal distance Bga is smaller than the horizontal distance Bgb. Moreover, an angle θsa of the wedge-shaped oxide film 8sa formed at the end of the element region 6a of the memory cell is given. An angle θsb of the wedge-shaped oxide film 8sb formed at the end of the element region 6b of the peripheral transistor is given. In this case, the angle θsa is smaller than the angle θsb. Likewise, an angle θga of the wedge-shaped oxide film 9ga formed at the end of the gate electrode 4a of the memory cell is given. An angle θgb of the wedge-shaped oxide film 9gb formed at the end of the gate electrode 4b of the peripheral transistor is given. In this case, the angle θga is smaller than the angle θgb.

As described above, the wedge-shaped oxide films 8sa (or 9ga) formed on the gate insulating film 3a of the memory cell is smaller than the wedge-shaped oxide films 8sb (or 9gb) formed on the gate insulating film 3b of the peripheral transistor. Therefore, it is possible to restrain an increase of the effective film thickness of the gate insulating film 3a of the memory cell having micro channel region width, and to obtain high device characteristic. On the other hand, the peripheral transistor has a sufficiently wide channel region width capable of disregarding the area of the wedge-shaped oxide film formed at the gate insulating film 3b. Therefore, there is no problem even if the gate insulating film 3b is formed with a wedge-shaped oxide film larger than the wedge-shaped oxide film formed of the memory cell.

Both horizontal distance and angle θf each wedge-shaped oxide film formed at the gate insulating films 3a and 3b do not always satisfy the relationship described above. The memory cell can obtain high device characteristic so long as one of the horizontal distance and angle satisfies the relationship described above.

In the semiconductor device of the embodiment, oxidization is sufficiently carried out with respect to the peripheral transistor in order to prevent a junction leak current, and thereby, etching damage is recovered. Simultaneously, necessary oxidization is only carried out with respect to the memory cell. By doing so, it is possible to prevent device characteristic from being worsened resulting from a reduction of the element region width of the memory cell.

The method of manufacturing the non-volatile semiconductor device according to the embodiment will be described below with reference to FIG. 4A, FIG. 4B and FIG. 6A, FIG. 6B to FIG. 12A and FIG. 12B. FIG. 4A and FIG. 6A to FIG. 12A show a cross-sectional view of the memory cell. FIG. 4B and FIG. 6B to FIG. 12B show a cross-sectional view of the peripheral transistor.

As shown in FIG. 6A and FIG. 6B, well/channel region 2a of the memory cell and well/channel region 2b of the peripheral transistor are formed in the silicon semiconductor substrate 1 using ion implantation. The surface of the silicon substrate 1 is formed with a gate insulating film (e.g., silicon oxide film) 3 of the foregoing memory cell and peripheral transistor. Thereafter, a first gate electrode layer (e.g., polysilicon) 4 is formed on the gate insulating film 3. The first gate electrode layer functions as a gate electrode of the memory cell, and as a part of a gate electrode of the peripheral electrode. A silicon nitride film 5 is further formed on the first gate electrode layer 4. The silicon nitride film 5 is used as a mask material for etching an isolation trench formed with an isolation region.

Figure 7A:
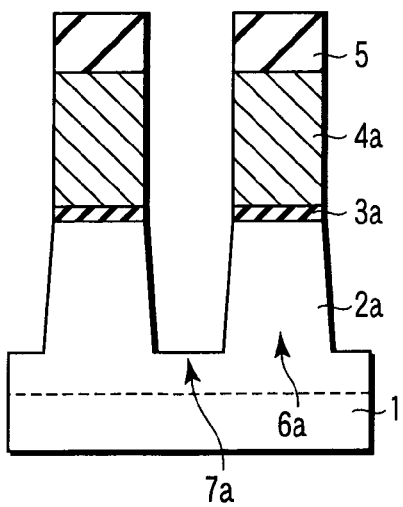
FIG. 7A and FIG. 7B are cross-sectional views to explain a second process of the method of manufacturing the semiconductor device of the embodiment.
Figure 7B:
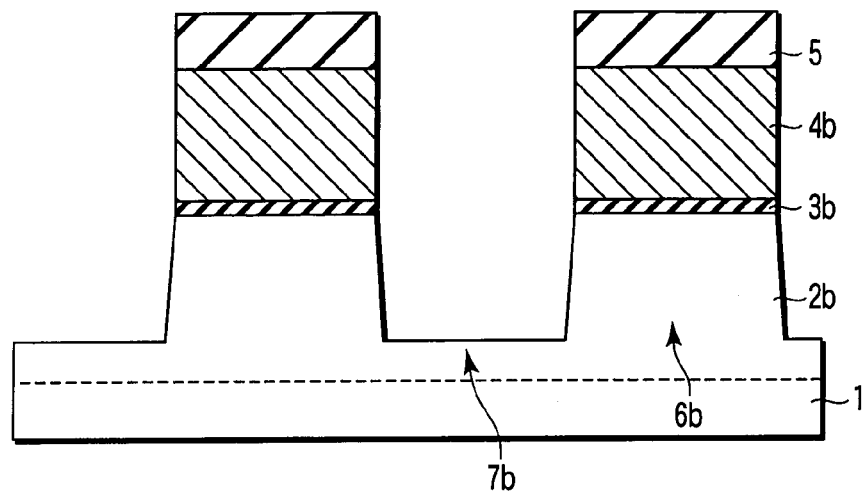

Then, a resist film is patterned using lithography process to protect element regions. As illustrated in FIG. 7A and FIG. 7B, the foregoing mask material 5, first gate electrode layer 4, gate insulating film 3 and silicon substrate 1 are successively etched using RIE. By doing so, the silicon substrate 1 is formed with each isolation trench for forming isolation regions 7a and 7b of the memory cell and the peripheral transistor. The isolation region 7a and 7b isolates an element region 6a of the memory cell and an element region 6b of the peripheral transistor, respectively. In this case, the element region 6a of the memory cell has a width smaller than the element region 6b of the peripheral transistor. Moreover, the isolation region 7a of the memory cell has a width smaller than the isolation region 7b of the peripheral transistor. For example, the isolation region 7a of the memory cell has a width of 0.1 µm or less while the isolation region 7b of the peripheral transistor has a width of 1 µm or more.

Figure 8A:
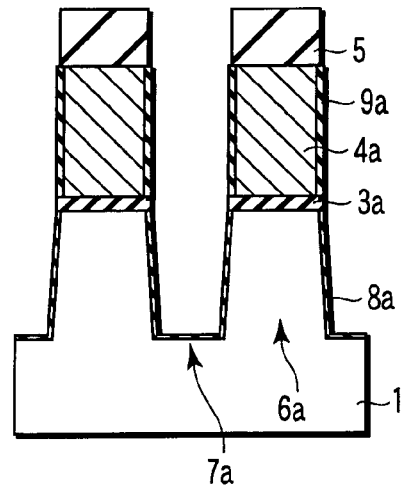
FIG. 8A and FIG. 8B are cross-sectional views to explain a third process of the method of manufacturing the semiconductor device of the embodiment.
Figure 8B:
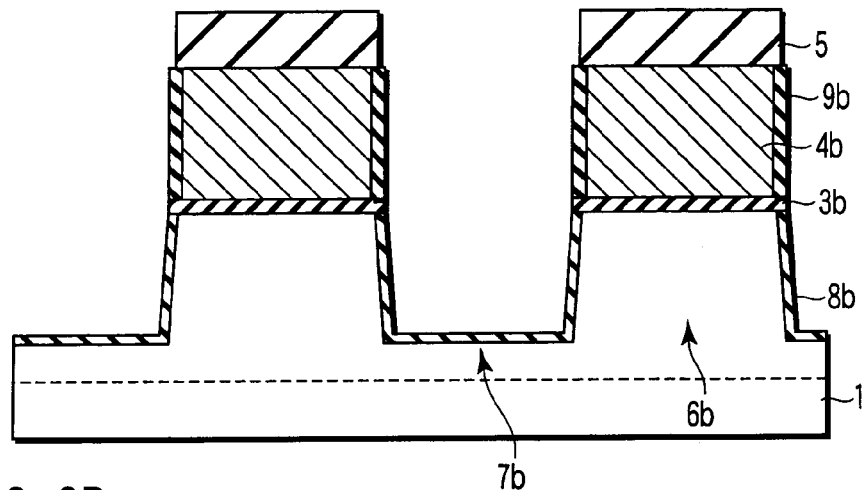
Figure 9A:
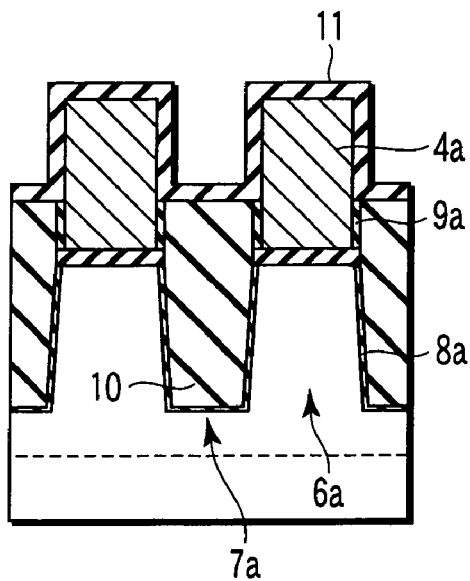
FIG. 9A and FIG. 9B are cross-sectional views to explain a fourth process of the method of manufacturing the semiconductor device of the embodiment.
Figure 9B:
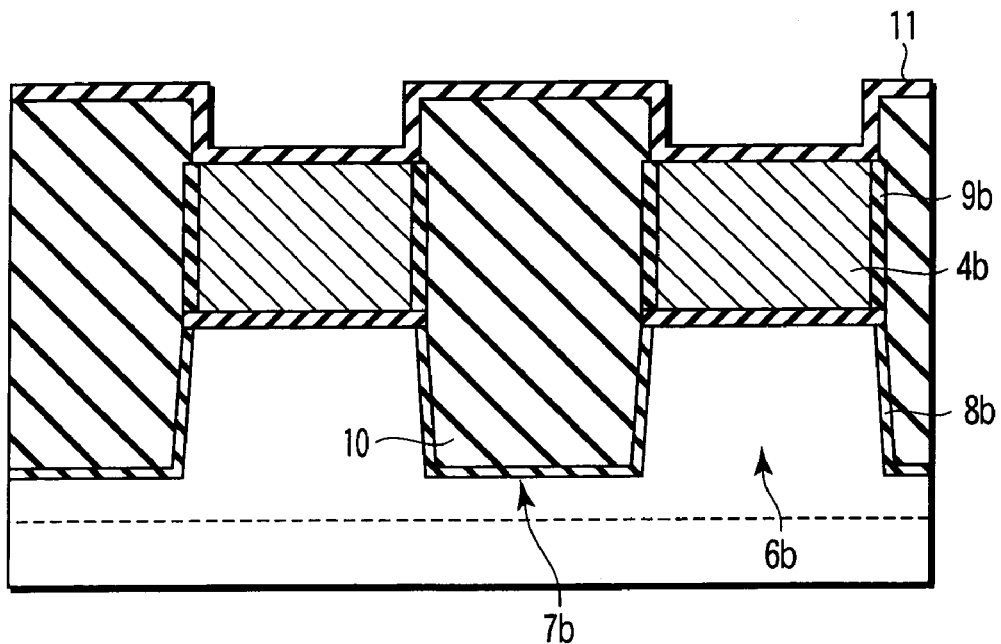

As depicted in FIG. 8A and FIG. 8B, the surface of the silicon substrate is oxidized using thermal oxidization. By doing so, the surface of the isolation trench formed with the isolation region 7a of the silicon substrate 1 is formed with a silicon oxide film 8a. On the other hand, the surface of the isolation trench formed with the isolation region 7b of the silicon substrate 1 is formed with a silicon oxide film 8b. By the thermal oxidization, the sidewall of the gate electrode 4a of the memory cell is formed with a silicon oxide film 9a while the sidewall of the gate electrode 4b of the peripheral transistor is formed with a silicon oxide film 9b.

In this case, oxidization using radical oxygen is carried out as the thermal oxidization, and thereby, the following advantage is obtained. The silicon oxide film 8a formed at the sidewall of the memory cell element region 6a is formed thinner than the silicon oxide film 8b formed at the sidewall of the peripheral transistor element region 6b. Because the isolation region 7a has a small width while the isolation region 7b has a large width. Moreover, the silicon oxide film 9a formed at the sidewall of the gate electrode 4a of the memory cell is formed thinner than the silicon oxide film 9b formed at the sidewall of the gate electrode 4b of the peripheral transistor. This is based on the following reason. More specifically, the amount of oxidization of the each sidewall of element region and gate electrode depends on the isolation region width. The amount of oxidization is a little in the memory cell because the isolation region 7a has a small width, while it is much in the peripheral transistor because the isolation region 7b has a large width.

For example, oxidization using radical oxygen is carried out under the conditions described below.

Oxidization atmosphere: $Ar/H_2/O_2=500/5/5$ sccm.
Pressure: 133.33 Pa
Treatment temperature: 600° C.
Oxidization time: 40 sec.

By doing so, the sidewall of the element region 6a of the memory cell is formed with a silicon oxide film 8a of 2 nm while the sidewall of the gate electrode 4a thereof is formed with a silicon oxide film 9a of 2.4 nm. Concurrently, the sidewall of the element region 6a of the peripheral transistor is formed with a silicon oxide film 8b of 4 nm while the sidewall of the gate electrode 4b thereof is formed with a silicon oxide film 8a of 4.8 nm.

The foregoing oxidization using radical oxygen is carried out, and thereby, silicon oxide films 8a and 8b are simultaneously formed via one-time oxidization process. More specifically, the sidewall of the element region 6a of the memory cell is formed with a thin silicon oxide film 8a. Simultaneously, the sidewall of the element region 6b of the peripheral transistor is formed with a thin silicon oxide film 8b thicker than the silicon oxide film 8a. Therefore, there is no need of forming the isolation region separately from the memory cell and the peripheral transistor. In addition, each sidewall of the element regions is formed with silicon oxide film having different thickness. Consequently, this serves to reduce the manufacturing cost.

An isolation insulating film (e.g., silicon oxide film) 10 is formed in isolation trenches formed with isolation regions 7a and 7b, and then, planarized using CMP. Thereafter, the mask material 5 is removed. As seen from FIG. 9A and FIG. 9B, the isolation insulating film 10 of the memory cell is etched to reduce the height as the need arises, thereby forming an inter-gate insulating film 11.

Figure 10A:
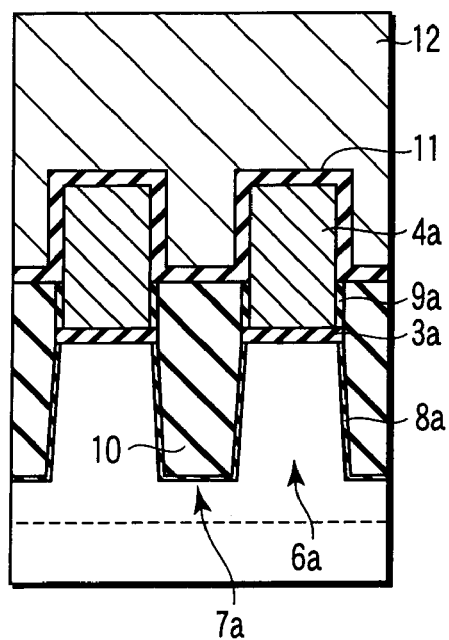
FIG. 10A and FIG. 10B are cross-sectional views to explain a fifth process of the method of manufacturing the semiconductor device of the embodiment.
Figure 10B:
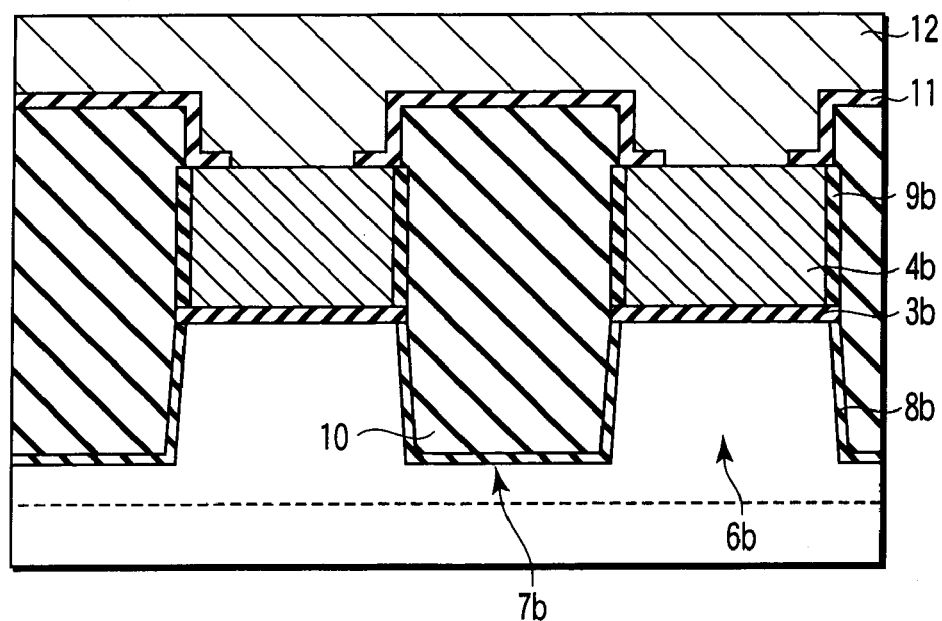

As shown in FIG. 10B, part of the gate insulating film 11 is removed in the peripheral transistor, and simultaneously, the same as above is removed in the select transistor although not shown. As illustrated in FIG. 10A and FIG. 10B, a control gate electrode of the memory cell, that is, second gate electrode layer 12 comprising a stacked film of polysilicon and silicide is formed. In this case, the first gate electrode layer and the second gate electrode layer 12 are electrically connected in the peripheral transistor and the select transistor.

Figure 11A:
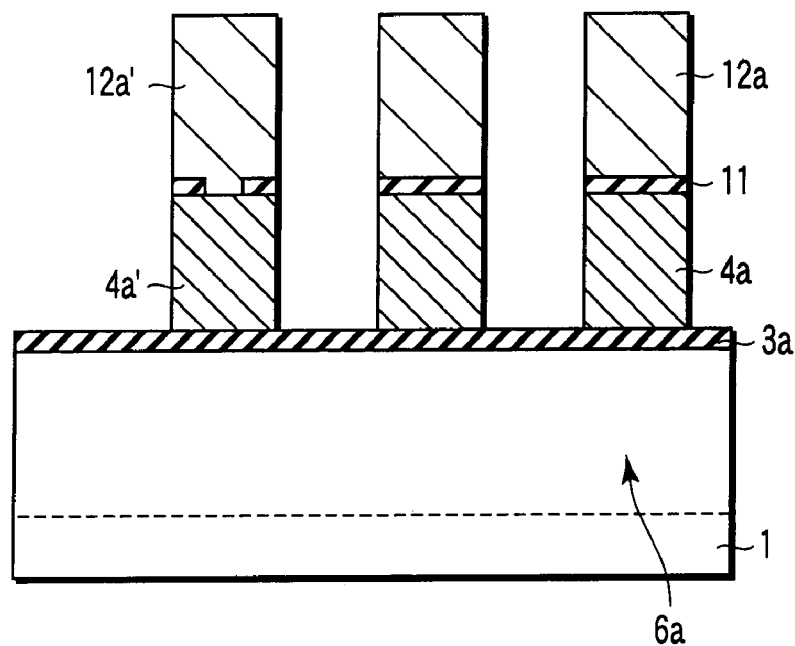
FIG. 11A and FIG. 11B are cross-sectional views to explain a sixth process of the method of manufacturing the semiconductor device of the embodiment.
Figure 11B:
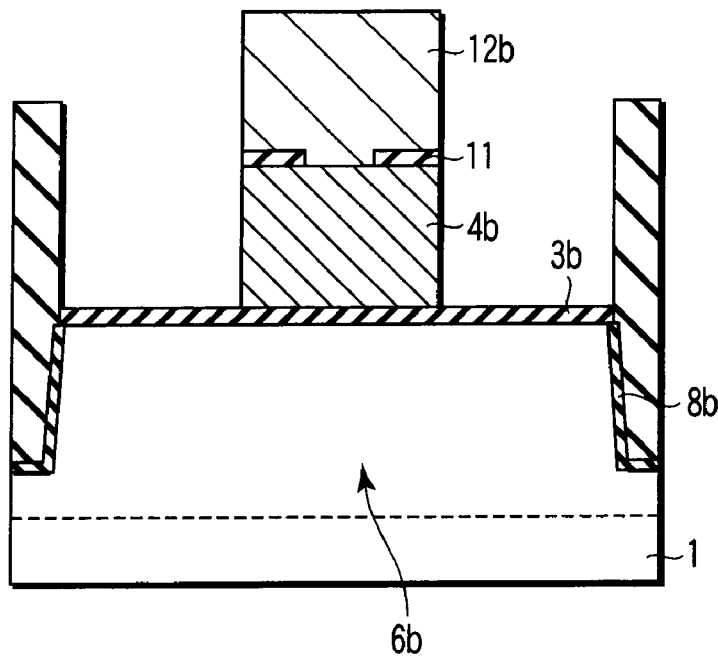

A resist film for protecting a gate electrode is patterned and formed on the second gate electrode layer 12 using lithography process. The foregoing second gate electrode layer 12, inter-gate insulating film 11, first gate electrode layers 4a and 4b are successively etched. By doing so, the following gate electrodes are formed as seen from FIG. 11A and FIG. 11B. The gate electrodes are floating gate electrode 4a and control gate electrode 12a of the memory cell, gate electrodes 4a' and 12a' of the select transistor, gate electrodes 4b and 12b of the peripheral transistor. FIG. 11A and FIG. 11B each show cross-sectional views in the direction perpendicular to the cross sections shown in FIG. 10A and FIG. 10B.

Figure 12A:
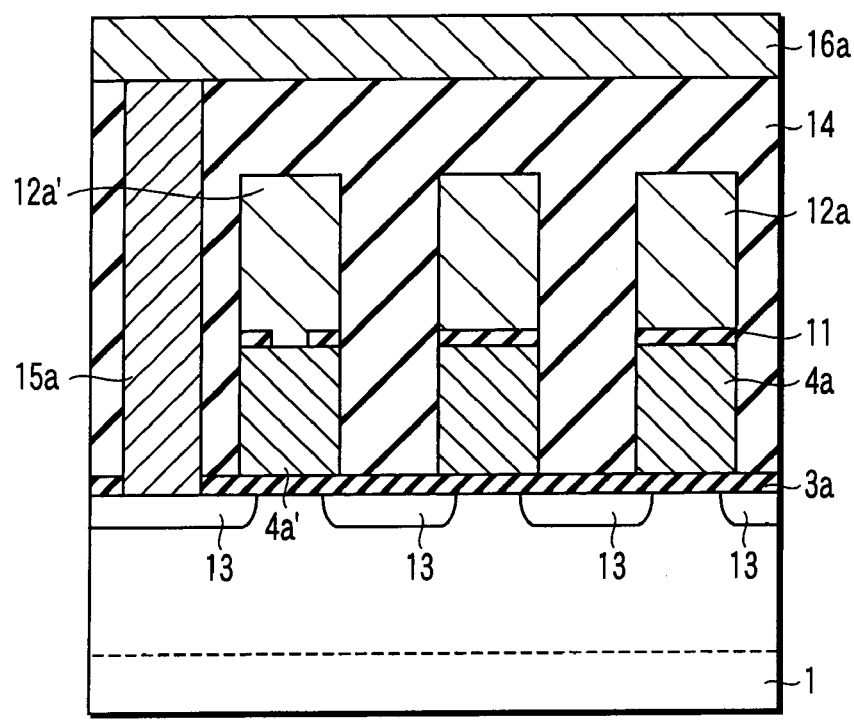
FIG. 12A and FIG. 12B are cross-sectional views to explain a seventh process of the method of manufacturing the semiconductor device of the embodiment.
Figure 12B:
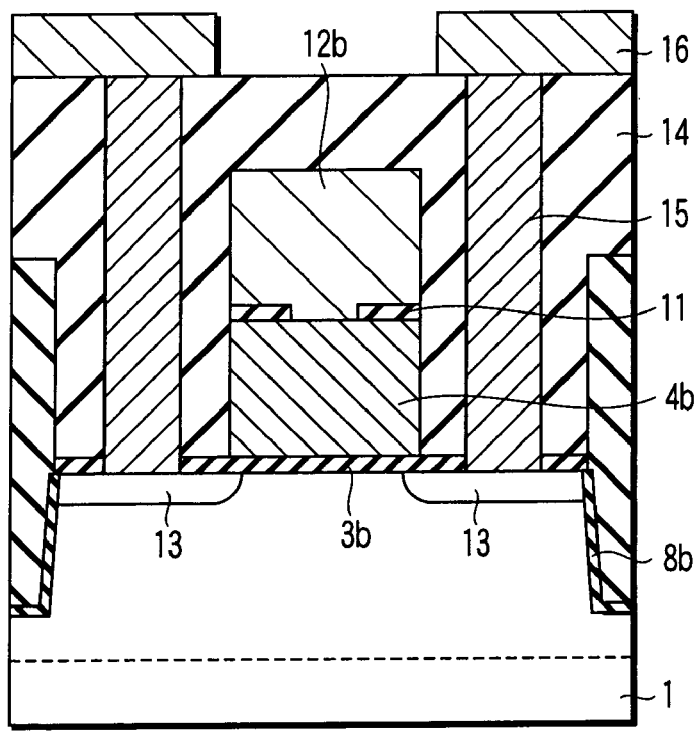

As depicted in FIG. 12A and FIG. 12B, the gate insulating film is thermally oxidized as a need arises. Source/drain diffusion layer 13, interlayer insulating film 14, contact electrode 15, bit line contact electrode 15a, interconnect 16 and bit line 16a are formed using a generally known process. The memory cell and the peripheral transistor are manufactured via the processes described above. Incidentally, FIG. 4A and FIG. 4B are cross-sectional views including the gate electrode in the direction perpendicular to FIG. 12A and FIG. 12B.

Thereafter, upper interconnect layers are further formed using a generally known process, and thus, a non-volatile semiconductor memory is manufactured.

According to the manufacturing method described above, the isolation trench is formed, and thereafter, the semiconductor substrate sidewall functioning as the element region is oxidized to recover etching damages. The foregoing process is carried out via thermal oxidization using radical oxygen. By doing so, the oxide film formed at the element region sidewall of the memory cell is formed thinner than the oxide film formed at the element region sidewall of the peripheral transistor. Because the memory cell has a narrow isolation region width (distance between element regions is small) while the peripheral transistor has a wide isolation region width (distance between element regions is large).

According to the foregoing thermal oxidization using radical oxygen, the oxide film formed at the element region sidewall of the memory cell is formed thinner than that of the peripheral transistor via one-time oxidization process. Therefore, it is possible to prevent deterioration of device characteristic of the memory cell without increasing the manufacturing cost. More specifically, the isolation regions of the memory cell and the peripheral transistor are separately formed. The oxide film formed at the element region sidewall of the memory cell is formed thinner than that of the peripheral transistor via the same oxidization process without separately oxidizing element region sidewalls. Thus, it is possible to prevent an increase of the manufacturing cost resulting from an increase of the number of processes. In addition, it is possible to prevent deterioration of device characteristic of the memory cell resulting from a reduction of the element region width of the memory cell.

According to the manufacturing method of the present embodiment, the following structure is given via one-time oxidization process. That is, the oxide film formed at the element region sidewall of the memory cell is formed thinner than that of the peripheral transistor. Therefore, it is possible to prevent deterioration of device characteristic of the memory cell without increasing the manufacturing cost.

In the embodiment, the isolation region is formed using the gate insulating film and part of the gate electrode as a mask. Oxidization using radical oxygen described in the embodiment may be used in the case where gate insulating film and gate electrode are formed after the isolation region is formed. In also case, the effect of the present invention is obtained. That is, a silicon oxide film formed at the element region sidewall of the memory cell having a narrow isolation region width is formed thinner than that of the peripheral transistor having a wide isolation region width.

According to the embodiment of the present invention, in order to restrain a junction leak current, sufficient oxidization is carried out with respect to the peripheral transistor, and thereby, etching damages are recovered. Simultaneously, necessary oxidization is only carried out with respect to the memory cell. Therefore, it is possible to provide a semiconductor device, which can prevent deterioration of device characteristic of the memory cell resulting from a reduction of the element region width of the memory cell. Moreover, the following structure is given via one-time oxidization process. That is, the oxide film formed at the element region sidewall of the memory cell is formed thinner than that of the peripheral transistor. Therefore, it is possible to provide a method of manufacturing a semiconductor device, which can achieve the foregoing object without increasing the manufacturing cost.

The present invention is not limited to the foregoing embodiment, and the configuration is changed or added, and thereby, various embodiments may be provided.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method of manufacturing a semiconductor device, comprising:
    forming a first film and a second film on a semiconductor substrate;
    removing the second film, the first film and the semiconductor substrate to form a first isolation trench, and forming a first element region, a first gate insulating film and a first gate electrode, which are isolated via the first isolation trench;
    removing the second film, the first film and the semiconductor substrate to form a second isolation trench, and forming a second element region, a second gate insulating film and a second gate electrode, which are isolated via the second isolation trench; and
    forming a first oxide film on a sidewall of the first element region while forming a second oxide film on a sidewall of the second element region,
    wherein the first isolation trench has a width narrower than the second isolation trench,
    the first oxide film has a thickness thinner than the second oxide film,
    the first gate electrode contacting with the first gate insulating film has a width narrower than the first element region contacting with the first gate insulating film in a channel width direction of the first element region, and
    the second gate electrode contacting with the second gate insulating film has a width narrower than the second element region contacting with the second gate insulating film in a channel width direction of the second element region.

2. The method according to claim 1, wherein the first and second isolation trenches are formed via the same process.

3. The method according to claim 1, wherein the first and second oxide films are formed via the same process.

4. The method according to claim 3, wherein the first and second oxide films are formed in an atmosphere containing radical oxygen.

5. The method according to claim 1, further comprising:
    forming a control gate electrode on the first gate electrode with an insulating film interposed between the control gate electrode and the first gate electrode,
    wherein the first gate electrode is a floating gate electrode.

* * * * *